United States Patent [19]

Ooike

[11] Patent Number: 5,146,158
[45] Date of Patent: Sep. 8, 1992

[54] EXTERNALLY ADJUSTABLE STOPPER PLATE IN A CROSS-COIL TYPE METER

[75] Inventor: Yukio Ooike, Shizuoka, Japan

[73] Assignee: Yazaki Corporation, Tokyo, Japan

[21] Appl. No.: 664,687

[22] Filed: Mar. 5, 1991

[30] Foreign Application Priority Data

Mar. 12, 1990 [JP] Japan .................. 2-23736[U]
Aug. 6, 1990 [JP] Japan .................. 2-82766[U]

[51] Int. Cl.$^5$ ............................................. G01R 1/20
[52] U.S. Cl. ........................... 324/146; 235/96; 235/144 ME; 324/154 R
[58] Field of Search ........... 324/146, 147, 144, 154 R, 324/131; 235/144 R, 144 ME, 144 MA, 144 EA, 144 E, 96, 97

[56] References Cited

U.S. PATENT DOCUMENTS

| | | | |
|---|---|---|---|
| 2,273,848 | 2/1942 | Ely et al. ................... | 235/97 X |
| 2,514,745 | 7/1950 | Dalzell ......................... | 171/95 |
| 2,657,919 | 11/1953 | McCandless ................. | 73/519 |
| 2,714,000 | 7/1955 | O'Connor et al. .......... | 324/154 R X |
| 2,886,783 | 5/1959 | Sicho ........................... | 324/155 |
| 3,698,353 | 10/1972 | Nakahata et al. .......... | 324/154 R X |
| 4,206,406 | 6/1980 | Scannell et al. ............ | 324/154 R |
| 4,354,097 | 10/1982 | Menager ..................... | 235/96 |
| 4,646,007 | 2/1987 | Faria ............................ | 324/146 |

FOREIGN PATENT DOCUMENTS

| | | |
|---|---|---|
| 206909 | 8/1909 | Fed. Rep. of Germany . |
| 1118878 | 7/1961 | Fed. Rep. of Germany . |
| 3116106 | 11/1982 | Fed. Rep. of Germany . |
| 3219290 | 1/1983 | Fed. Rep. of Germany . |

*Primary Examiner*—Kenneth A. Wieder
*Assistant Examiner*—Warren S. Edmonds
*Attorney, Agent, or Firm*—Armstrong & Kubovcik

[57] ABSTRACT

The cross coil type meter has a magnet rotor and a stopper plate inside a coil bobbin. The magnet rotor is driven by a combined magnetic field produced by a cross coil wound on the coil bobbin. A pointer on a dial plate is attached to the magnet rotor's shaft so that it can indicate the magnitude of a measured quantity. The stopper plate engages with the magnet rotor to stop the pointer at a zero position on the dial plate. But when due to some assembly errors the stop position of the pointer and the zero position on the dial plate do not agree, the position of engagement between the magnet rotor and the stopper plate can be adjusted by manipulating the stopper plate from outside until the two positions agree. The stopper plate also has spring pieces formed either around the inner or outer circumference thereof to give a constant contacting resistance between the stopper plate and the coil bobbin, so that the rotating torque of the stopper plate is kept constant, making the position adjustment of the stopper plate smooth and reliable.

8 Claims, 4 Drawing Sheets

EXTERNALLY ADJUSTABLE STOPPER PLATE IN A CROSS-COIL TYPE METER

BACKGROUND OF THE INVENTION

The present invention relates to a meter of cross coil type and more particularly to a cross coil type meter equipped with a zero point stopper whose position is adjustable.

Prior Art

A conventional meter widely used in automobiles that indicates the magnitude of a measured quantity has the following construction in general. A pair of coils that generate magnetic fields perpendicular to each other is supplied with electric current that changes according to the measured value. A magnet rotor is rotated in a direction of a combined field of the magnetic fields produced by the pair of coils. A pointer that rotates together with the magnet rotor indicates the magnitude of the measured quantity.

FIG. 9 shows a meter unit I of this kind such as speed meter and revolution meter. A movement 2 of the meter unit I has a coil bobbin 3, on which are wound two coils 4, 4 that are disposed perpendicular to each other. Inside the coil bobbin 3, which is wound with the coils 4, 4, there is installed a disc-like magnet rotor 5 with magnetic poles S and N, as shown. The magnet rotor 5 has at the center a rotating shaft 6 that extends along the axis of the coil bobbin 3. The rotating shaft 6 or the magnet rotor 5 is free to rotate when the coils 4, 4 are not applied with electric current. When current is applied to the coils 4, 4, the magnet rotor 5 is driven to rotate through a specified angle.

The movement 2 has a dial plate 7 on the top, and the upper end of the rotating shaft 6 is passed through the dial plate 7 with the movement 2 attached to the back of the dial plate 7. A pointer 8 disposed above the dial plate is attached to the upper end of the rotating shaft 6.

The movement 2 is provided with a zero-return means such as a hairspring (not shown) connected at one end to the coil bobbin 3 or a zero-return magnet (not shown). When the coils 4 are not energized so that the rotating shaft 6 can freely be rotated, the stored force of the hairspring or the magnetic force of the zero-return magnet causes the rotating shaft 6 to return to the specified zero position. A movement case 9 is installed around the coil bobbin 3 to shield the magnetic field. This is the construction of the meter unit I. As a means to stop the pointer 8 secured to the rotating shaft 6 at the zero position on the dial plate 7, a stopper pin (not shown) is erected on the dial plate 7.

However, the provision of the stopper pin on the dial plate 7 gives a driver an impression of untidiness in the design of the meter. It also results in an increase in the number of parts and also of the assembly processes.

To eliminate this problem, another construction has been available. In this construction, as shown in Figure 10, an engagement projection 10 protruding downwardly is formed in the upper part of a chamber in the coil bobbin 3 containing the magnet rotor 5. The magnet rotor 5 is formed at its upper surface with an annular groove 12 that receives the engagement projection 10. The annular groove 12 also has an engagement plate 11 for engagement with the engagement projection 10. When the rotating shaft 6 returns to the specified zero position by the force of the zero-return means, the engagement projection 10 comes into contact with the engagement plate II. With this construction, the engagement projection 10 and the engagement plate II together form the zero-point stopper, and there is no need to provide the stopper pin on the dial plate 7, making the design of the face of the dial plate 7 simple and neat.

The conventional meter mentioned above, however, has the following drawback. The position at which the engagement projection 10 on the coil bobbin 3 engages with the engagement plate II on the magnet rotor 5 is the stop position of the pointer 8. This stop position is determined in the design stage and fixed. Hence, even when the pointer 8 is mounted to the rotating shaft 6 during the assembly of the meter unit I in such a way that the pointer indicates a correct reading, the stop position of the pointer 8 may not agree with the zero position on the dial plate 7 because of the fixed zero-point stopper. Conversely, when the stop position of the pointer 8 is made to correspond to the zero position on the dial plate 7, the reading of the pointer 8 may lose accuracy.

SUMMARY OF THE INVENTION

The present invention has been accomplished with a view to overcoming the above drawback and its objective is to provide a cross coil type meter which can reset the pointer to the zero position on the dial plate properly without forming a stopper pin on the dial plate.

To achieve the above objective, the cross coil type meter of this invention comprises: a coil bobbin; a cross coil consisting of two perpendicularly arranged coils wound on said coil bobbin; a magnet rotor installed inside the coil bobbin in such a manner that the magnet rotor can be rotated on a rotating shaft thereof; a zero-return means for returning the rotating shaft to a zero position when the cross coil is not energized; a movement consisting of said coil bobbin, said cross coil, said magnet rotor, and said zero-return means; a dial plate attached to the movement; a pointer attached to the end of the rotating shaft of the magnet rotor, said pointer together with the dial plate being adapted to indicate a measured value; and a stopper plate installed in the coil bobbin, said stopper plate being adapted to engage with the magnet rotor; whereby said magnet rotor is driven to rotate through a specified angle according to a combined magnetic field generated by said two coils of the cross coil when they are energized in order to indicate a measured value by the pointer on the dial plate, said magnet rotor is freed for rotation when the cross coil is deenergized so that the pointer is reset to the zero position by the zero-return means, and said stopper plate is so arranged that its position can be adjusted from outside the movement.

In another construction of the cross coil type meter, the pointer attached to the rotating shaft is located between an odometer and a trip meter; and a stopper rod is provided to a counter frame that supports the odometer and the trip meter, in such a manner that one end of the stopper rod is engageable with the rotating shaft and the other end projects out of the movement thus allowing the position adjustment of the stopper rod from outside.

With this invention, since the stopper plate is installed in the coil bobbin in such a way that it can engage with the magnet rotor and can also be adjusted in position from outside the movement, the stopper pin on the dial plate can be eliminated, making the design of the face of the dial plate simple and neat. When the stop position of the pointer and the zero position on the dial plate do not agree, this invention also has the advantage of being able to adjust and return the pointer correctly to the zero position on the dial plate.

In another construction in which the pointer attached to the rotating shaft is located between the odometer and the trip meter, the stopper rod that is engageable with the rotating shaft is so mounted to the counter frame, on which the odometer and the trip meter are supported, that the position of the stopper rod can be adjusted from outside the counter frame. This arrangement, as with the preceding construction, makes it possible to remove the stopper pin from the face of the dial plate, making the design of the dial plate simple. Furthermore, when the stop position of the pointer does not coincide with the zero position on the dial plate, this construction enables the pointer to be reset correctly to the zero position on the dial plate.

BRIEF DESCRIPTION OF THE DRAWINGS

FIGS. 3 through 6 show a stopper plate and its modification used in the movement; of which FIG. 3 is a cross-sectional view of the movement using the above stopper plate;

FIG. 4 is a plan view of the stopper plate of FIG. 3;

FIG. 5 is a plan view of a modified example of the stopper plate;

FIG. 6 is a cross-sectional view of the stopper plate of FIG. 5;

PREFERRED EMBODIMENTS OF THE INVENTION

Embodiments of this invention will be described by referring to FIGS. 1 through 8, in which like reference numbers are assigned to those parts that are identical with those in conventional meters.

Figure 1:
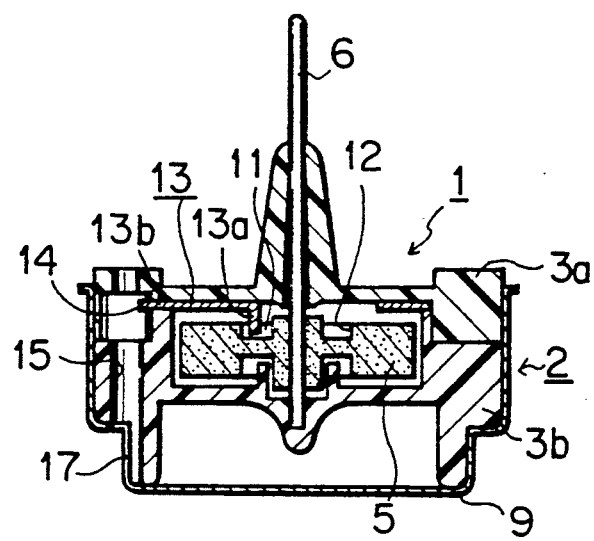
FIG. 1 is a cross-sectional view of a movement as one embodiment of this invention.
Figure 2:
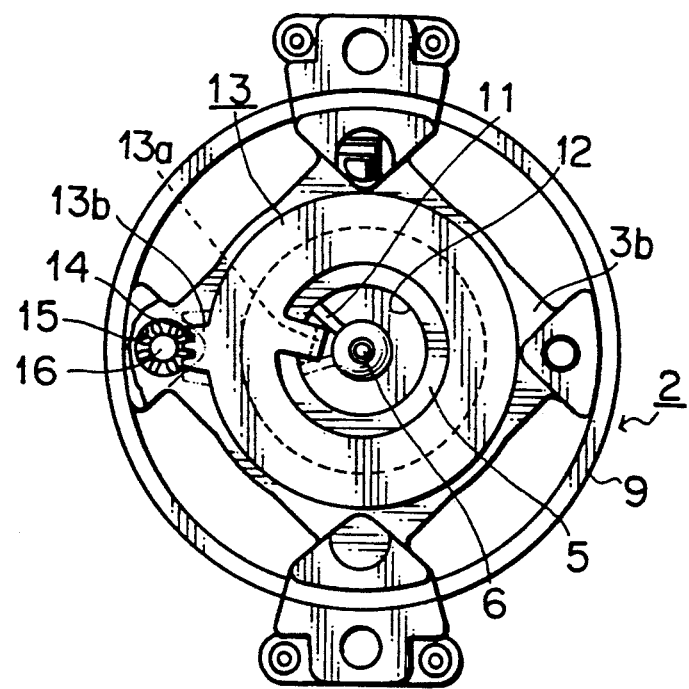
FIG. 2 is a plan view of the movement of FIG. 1.

FIGS. 1 and 2 show one embodiment of a meter unit I according to this invention. A movement 2 has a coil bobbin 3 which consists of an upper bobbin 3a and a lower bobbin 3b. On this coil bobbin 3 are wound two coils (not shown) that are disposed perpendicular to each other. Inside the coil bobbin 3 is installed a disc-shaped magnet rotor 5 with magnetic north and south poles. The magnet rotor 5 has at the center a rotating shaft 6 that extends along the axis of the coil bobbin 3. The rotating shaft 6 or the magnet rotor 5 is free to rotate when the coils are not energized. When the coils are energized, the magnet rotor 5 is driven to rotate a specified angle.

The movement 2 is provided with a zero-return means such as a hairspring (not shown) connected at one end to the coil bobbin 3 and a zero-return magnet (not shown). When the coils are not energized so that the rotating shaft 6 can freely be rotated, the stored force of the hairspring or the magnetic force of the zero-return magnet causes the rotating shaft 6 to return to a predetermined zero position.

In this embodiment, a stopper plate 13 which is a roughly donut-shaped thin plate is clamped between the contacting surfaces of the upper and lower bobbins 3a, 3b of the coil bobbin 3 with a specified torque such that the stopper plate 13 can be moved slightly along the contacting surfaces. A part of the inner circumference of the stopper plate 13 is bent to form an engagement piece 13a that projects into an annular groove 12 formed in the upper surface of the magnet rotor 5. The annular groove 12 in the upper surface of the magnet rotor 5 is formed with an engagement plate II that extends radially for engagement with the engagement piece I3a. When the rotating shaft 6 returns to the predetermined zero position by the action of the zero-return means, the engagement piece 13a comes into contact with the engagement plate 11. The stopper plate 13 is formed at a part of the outer circumference with a projection 13b, which has a serration 14 at the end. The serration 14 of the projection 13b protrudes into a jig hole 15 that vertically extends at a point on the outer circumference of the coil bobbin 3. As described later, the serration 14 is adapted to mesh with a jig 16 inserted into the jig hole 15 from outside.

Since the stopper plate 13 is installed inside the movement 2, it is made of nonmagnetic material such as brass plate.

Mounted on the outer circumference of the coil bobbin 3 is a movement case 9 that shields the magnetic field. The movement case 9 is formed with an opening 17 at a position corresponding to the jig hole 15 so that the jig 16 can be inserted from outside into the jig hole 15. On the upper surface of the movement is attached a dial plate (not shown), through which the upper end of the rotating shaft 6 is passed. The upper end portion of the rotating shaft 6 is then securely attached with a pointer (not shown). In this way the meter unit 1 is constructed.

In this embodiment, a specified amount of current as a drive signal which is proportional to a measuring signal is supplied to each coil, which in turn generates magnetic field. A resultant magnetic field of the two coil-generated fields causes the rotating shaft 6, i.e., the magnet rotor 5 to rotate, moving the pointer to indicate the result of measurement on the dial plate. When the coils are deenergized, as when the car stops, the rotating shaft 6 is set free and returned to the zero position by the zero-return means. At this time, the engagement piece 13a of the stopper plate 13 installed in the coil bobbin 3 abuts against the engagement plate II of the magnet rotor 5, so that the rotating shaft 6, i.e., the pointer stops at the zero position on the dial plate.

The procedure of attaching the pointer to the rotating shaft 6 is performed at the last stage of the process of assembling the meter unit I. A precaution is taken during the pointer assembly to ensure that the pointer indicates the correct value on the dial plate. Even with such a precaution, there may still be cases where the stop position of the pointer and the zero position on the dial plate do not agree when the rotating shaft 6 returns to the zero position.

In such a case, the jig 16 is inserted from outside the movement 2 into the jig hole 15 formed in the movement 2 of the meter unit I to engage with the stopper plate 13 through the serration 14, as shown in FIG. 2. The jig 16 is then turned to rotate the stopper plate 13 about 10 to 20 degrees along the contacting surfaces of the coil bobbin 3. This makes it possible to adjust the position at which the engagement piece 13a of the stopper plate 13 and the engagement plate II of the magnet rotor 5 engage, that is, the stop position of the pointer. In other words, after the meter unit I has been assembled, the pointer 8 can very easily be adjusted so that it returns to the zero position on the dial plate.

Since the stopper plate 13 is clamped with a sufficient torque in the coil bobbin 3, there is no possibility of the stopper plate 13 shifting its position after being adjusted by the jig 16.

FIGS. 3 through 6 show other examples of the stopper plate 13, in which the rotating torque required for making the position adjustment on the stopper plate 13 is stabilized.

Figure 3:
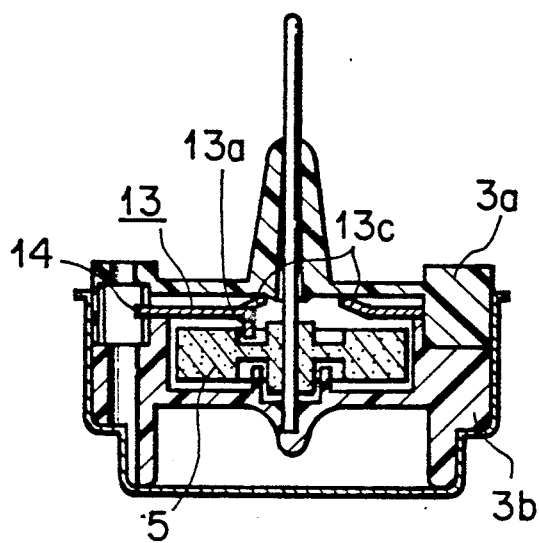
Figure 4:
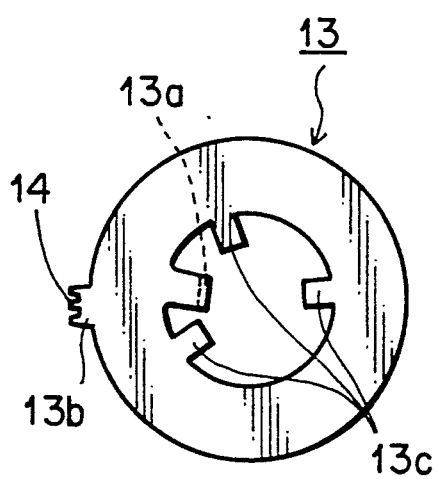

As shown in FIGS. 3 and 4, parts of the inner circumference of the nearly donut-shaped stopper plate 13 are bent upward to form a plurality of spring pieces 13c. With the stopper plate 13 installed between the upper and lower bobbins 3a, 3b, the spring pieces 13c contact an inner upper surface 3a' of the upper bobbin 3a.

The resilient force of the spring pieces 13c causes the outer circumferential portion of the stopper plate 13 to engage with the upper end surface of the lower bobbin 3b. As a result, the stopper plate 13 is held between the upper and lower bobbins 3a, 3b with a specified holding torque or resistance which is provided by the resilient force of the spring pieces 13c. This arrangement makes the holding torque of the stopper plate 13 almost constant even when the coil bobbin 3 itself expands or contracts due to temperature changes. The holding torque is much more constant than that obtained with the preceding example in which the stopper plate 13 is simply held between the upper and lower bobbins 3a, 3b. Thus, the rotating torque of the jig 16 required for adjusting the position of the stopper plate 13 can be stabilized, ensuring a smooth and reliable position adjustment.

Figure 5:
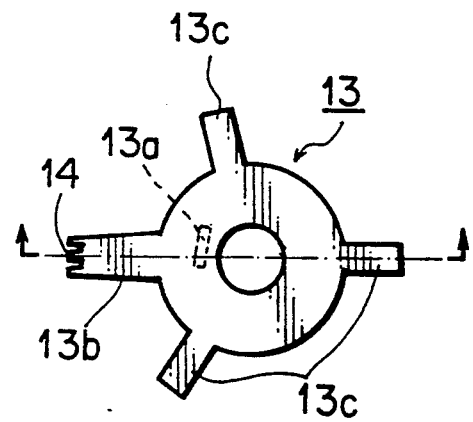
Figure 6:
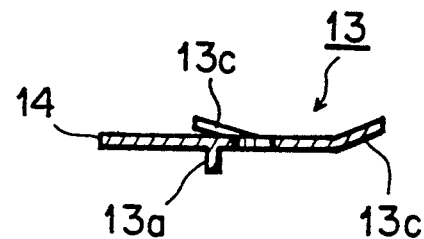

FIGS. 5 and 6 show still another modification of the stopper plate 13. A plurality of spring pieces 13c are formed at the outer circumference of the stopper plate 13. This arrangement can also stabilize the rotating torque of the jig 16 for the position adjustment.

Since in this embodiment the stopper plate 13 as a zero point stopper. which allows adjustment on the stop position of the pointer 8, is installed inside the movement 2, the stopper pin on the dial plate can be eliminated, simplifying the design of the face of the dial plate. Even when the stop position of the pointer 8 does not coincide with the zero position on the dial plate, this embodiment allows the pointer 8 to be returned correctly to the zero position on the dial plate.

Figure 7:
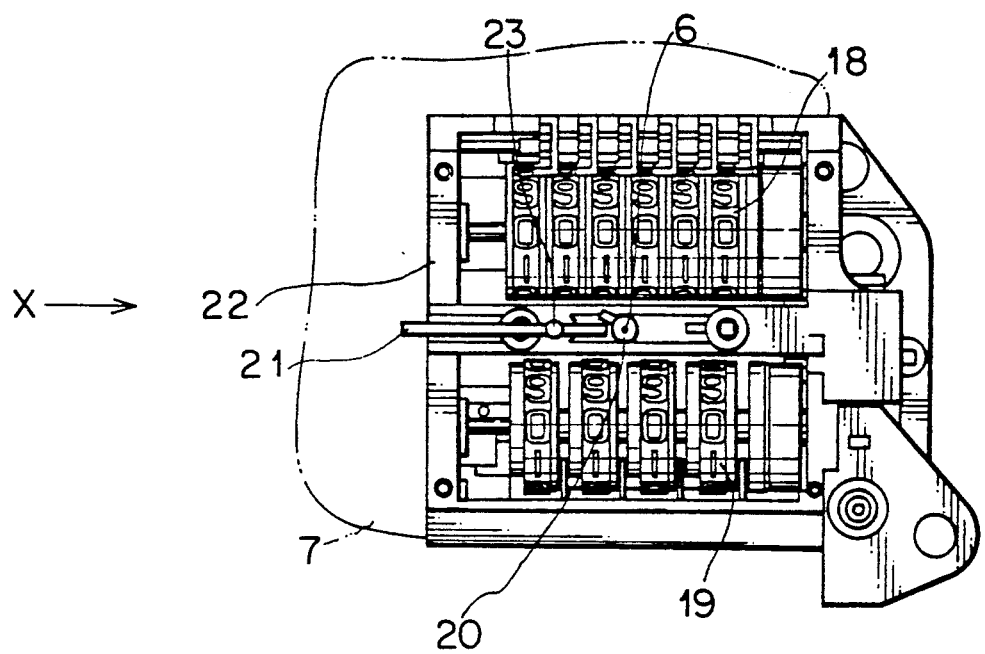
FIG. 7 is a plan view showing another embodiment of the invention.
Figure 8:
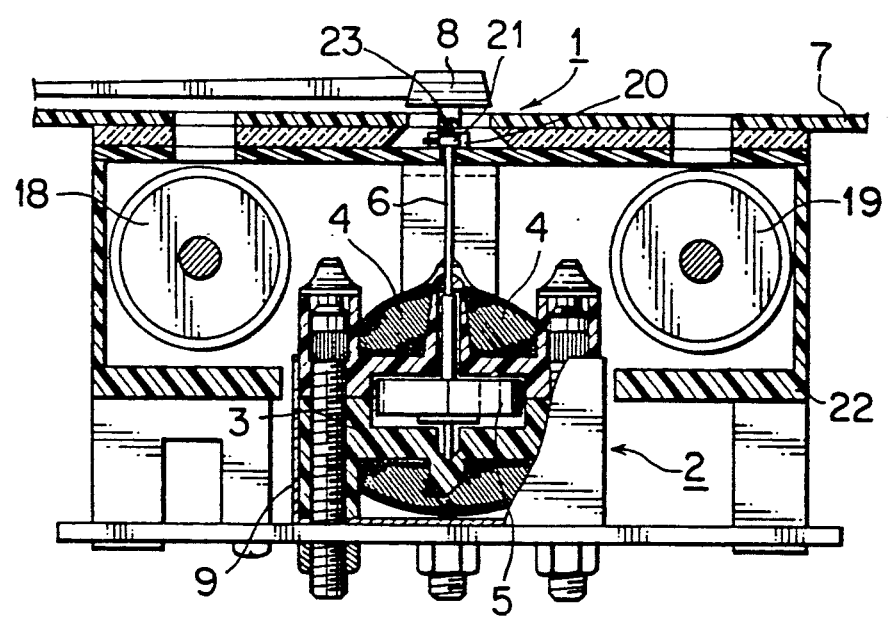
FIG. 8 is a cross-sectional view as seen from the arrow X in 7.
Figure 9:
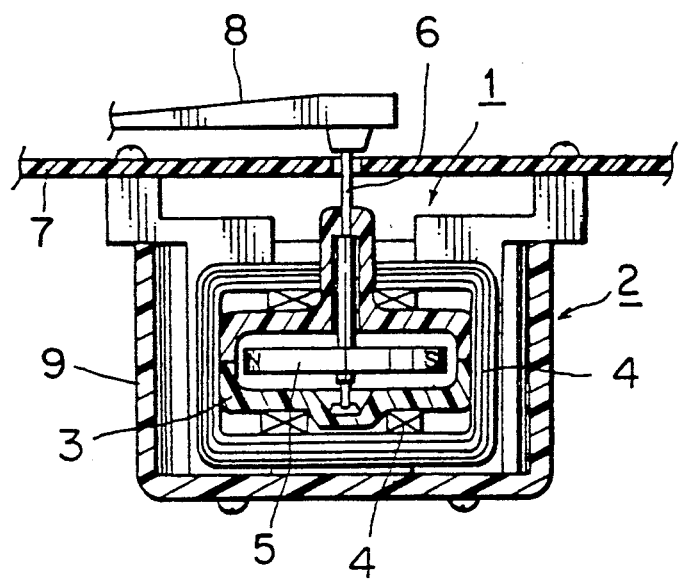
FIG. 9 is a cross-sectional view of a conventional cross coil type meter.
Figure 10:
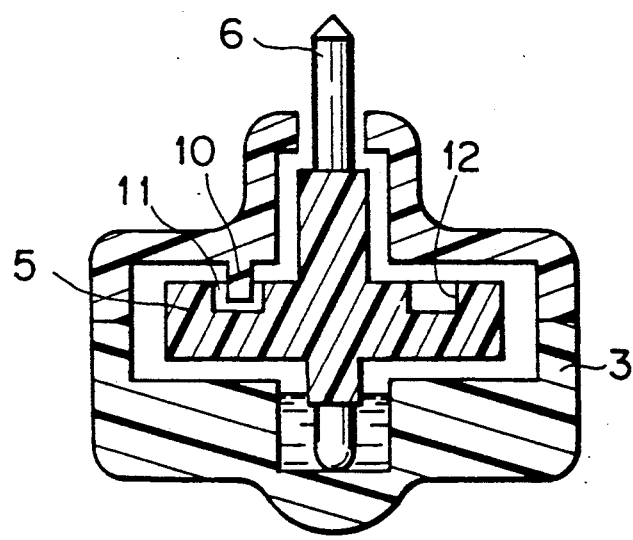
FIG. 10 is a cross-sectional view of another conventional cross coil type meter.

FIGS. 7 and 8 show another embodiment of the meter unit I according to this invention, in which the pointer 8 attached to the rotating shaft 6 of the movement 2 is located between an odometer 18 and a trip meter 19.

The upper end portion of the rotating shaft 6 is secured with an engagement plate 20. A stopper rod 21 which engages at one end with the engagement plate 20 has its intermediate portion pivotally supported on a counter frame 22, which supports the odometer 18 and the trip meter 19. The other end of the stopper rod 21 projects out of the counter frame 22. Operating the projected outer portion of the stopper rod 21 from the outside of the counter frame 22 causes the stopper rod 21 to rotate about the pivotal point 23.

In this embodiment, like the previous one, when the coils 4 in the movement 2 are deenergized, the rotating shaft 6 is freed for rotation, so that the rotating shaft 6 is returned by the zero-return means to the zero position. At this time, the engagement plate 20 of the rotating shaft 6 abuts against the stopper rod 21 pivotally secured to the counter frame 22, thereby stopping the shaft 6, i.e., the pointer 8 at the zero position on the dial plate 7.

If the stop position of the pointer 8 and the zero position of the dial plate 7 do not agree when the rotating shaft 6 returns to the zero position, the stopper rod 21 is manually rotated to adjust the position of engagement between the engagement plate 20 and the stopper rod 21. In this way, the adjustment can very easily be made to cause the pointer 8 to return to the zero position on the dial plate 7.

In this embodiment, too, since the engagement plate 20 and the stopper rod 21, which combine to work as a zero-point stopper with a pointer stop position adjustment capability, are provided to the rotating shaft 6 of the movement 2 and the counter frame 22, respectively, the stopper pin on the dial plate 7 can be eliminated, contributing to more simplified and neat design of the face of the dial plate. When the stop position of the pointer 8 and the zero position on the dial plate 7 do not agree after the meter unit 1 is assembled, the pointer 8 can be adjusted so that it returns to the exact zero position on the dial plate 7.

The construction and advantages of this invention may be summarized as follows. The stopper plate that is to engage with the magnet rotor is installed in the coil bobbin in such a manner that the position of the stopper plate can be adjusted from outside the movement. In another construction, in which the pointer attached to the end of the rotating shaft is located between the odometer and the trip meter, the stopper rod that is to engage with the rotating shaft is pivotally mounted to the counter frame that supports the odometer and the trip meter. The stopper rod can be manipulated from outside the counter frame to adjust the stop position of the rotating shaft or the pointer. These constructions eliminate the need for the stopper pin to be formed on the dial plate, making the design of the face of the dial plate more simple and neat. Even when the pointer,s stop position and the zero position on the dial plate does not coincide after the meter has been assembled, it is possible to make adjustment on the pointer until the pointer returns correctly to the zero position on the dial plate.

What is claimed is:

1. A cross coil type meter comprising:
   a coil bobbin;
   a cross coil consisting of two perpendiularly aranged coils wound on said coil bobbin;
   a magnet rotor installed inside the coil bobbin in such a manner that the magnet rotor can be rotated on a rotating shaft thereof;
   a zero-return means for returning the rotating shaft toa zero position when the cross coil isnot energized;
   a movement comprising said coilbobin, said cross coil, said magnet rotor, and said zero-return means;
   a dial plate attached to the movement;
   a point attached to the end of the rotating shaft of the magnet rotor, said pointer together with the dial plate being adapted to indicate a measured value; and a stopper plate installed in the coil bobbin, said stopper plate being adapted to engage with the magnet rotor;

means for adjusting the position of the stopper plate relative to the coil bobbin from outside the movement;

whereby said magnet rotor is driven to rotate through a specified angle according to a combined magnetic field generated by said two coils of the cross coil when they are energized in order to indicate a measured value by the pointer on the dial plate, said magnet rotor is freed for rotation when the cross coil is deenergized so that the pointer is reset to the zero position by the zero-return means, and said zero position of said pointer being accurately set by adjustment of said stopper plate from outside the movement by said means for adjusting.

2. A cross coil type meter as claimed in claim 1, wherein said stopper plate installed in the coil bobbin has at its inner circumference a downwardly projecting engagement piece and said magnet rotor has an annular groove formed in the upper surface thereof to receive the engagement piece and also has an engagement plate at a point in the annular groove for engagement with the engagement piece.

3. A cross coil type meter as claimed in claim 2, wherein said engagement piece of the stopper plate and the engagement plate in the annular groove of the magnet rotor determine a stop position of the pointer on the dial plate.

4. A cross coil type meter as claimed in claim 1, wherein said stopper plate is formed like a donut and has a serration formed at a part of the outer circumference thereof that meshes with a jig inserted into the movement and the position of the stopper plate is adjusted from outside the movement by manipulating the jig until the stop position of the pointer agrees with the zero position on the dial plate.

5. A cross coil type meter as claimed in claim 4, wherein said stopper plate has a plurality of spring pieces formed at the inner circumference thereof that are bent inwardly upwardly to produce a constant contacting resistance between the coil bobbin and the stopper plate so that the rotating torque of the stopper plate is kept constant to make the adjustment on the stopper plate position by the jig smooth and reliable.

6. A cross coil type meter as claimed in claim 4, wherein said stopper plate has a plurality of spring pieces formed at the outer circumference thereof that are bent outwardly upwardly to produce a constant contacting resistance between the coil bobbin and the stopper plate so that the rotating torque of the stopper plate is kept constant to make the adjustment on the stopper plate position by the jig smooth and reliable.

7. A cross coil type meter comprising:

a coil bobbin;

a cross coil consisting of two perpendicularly arranged coils wound on said coil bobbin;

a magnet rotor installed inside the coil bobbin in such a manner that the magnet rotor can be rotated on a rotating shaft thereof;

a zero-return means for returning the rotating shaft to a zero position when the cross coil is not energized;

a movement comprising of said coil bobbin, said cross coil, said magnet rotor, and said zero-return means;

a dial plate attached to the movement;

an odometer and a trip meter;

a pointer attached to the end of the rotating shaft of the magnet rotor, said pointer together with the dial plate being adapted to indicate a measured value, (said pointer being located between the odometer and the trip meter;) and a stopper rod provided to (a counter frame supporting the odometer and the trip meter,) said stopper rod being adapted to engage with the rotating shaft;

whereby said magnet rotor is driven to rotate through a specified angle according to a combined magnetic field generated by said two coils of the cross coil when they are energized in order to indicate a measured value by the pointer on the dial plate, said magnet rotor is freed for rotation when the cross coil is deenergized so that the pointer is reset to the zero position by the zero-return means, and said stopper rod is so arranged that its position can be adjusted from outside the counter frame.

8. A cross coil type meter as claimed in claim 7, wherein said stopper rod is pivotally mounted to the counter frame, one end of the stopper rod is engageable with the rotating shaft and the other end is projected out of the movement.

* * * * *